(12) United States Patent
Kuroda et al.

(10) Patent No.: US 7,741,700 B2
(45) Date of Patent: Jun. 22, 2010

(54) TRANSISTOR WITH HEAT DISSIPATING MEANS

(75) Inventors: Naotaka Kuroda, Tokyo (JP); Masahiro Tanomura, Tokyo (JP); Naoto Kurosawa, Kanagawa (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 418 days.

(21) Appl. No.: 11/547,402

(22) PCT Filed: Mar. 30, 2005

(86) PCT No.: PCT/JP2005/006165

§ 371 (c)(1),
(2), (4) Date: Sep. 29, 2006

(87) PCT Pub. No.: WO2005/096365

PCT Pub. Date: Oct. 13, 2005

(65) Prior Publication Data

US 2008/0230807 A1    Sep. 25, 2008

(30) Foreign Application Priority Data

Mar. 30, 2004    (JP) .............................. 2004-098911

(51) Int. Cl.
H01L 27/082    (2006.01)
H01L 27/102    (2006.01)
H01L 29/70    (2006.01)
H01L 31/11    (2006.01)

(52) U.S. Cl. ...................... 257/577; 257/197; 257/566; 257/720; 257/E27.032

(58) Field of Classification Search ................. 257/577, 257/566, 720, 197, E27.032
See application file for complete search history.

(56) References Cited

U.S. PATENT DOCUMENTS

2002/0195620 A1* 12/2002 Tanomura et al. ........... 257/197
2003/0111516 A1    6/2003 Ghoshal ..................... 228/134

FOREIGN PATENT DOCUMENTS

| JP | 55-056670 | 4/1980 |
|---|---|---|
| JP | 08-227896 | 9/1996 |
| JP | 08-279562 | 10/1996 |
| JP | 09-213711 | 8/1997 |
| JP | 10-125616 | 5/1998 |
| JP | 10-144801 | 5/1998 |
| JP | 11-274381 | 10/1999 |
| JP | 2000-277530 | 10/2000 |
| JP | 2001-060593 | 3/2001 |
| JP | 2001-168094 | 6/2001 |
| JP | 2002-344147 | 11/2002 |
| JP | 2003-224309 | 8/2003 |

* cited by examiner

Primary Examiner—Shouxiang Hu
(74) Attorney, Agent, or Firm—Young & Thompson

(57) ABSTRACT

A semiconductor device having sufficiently high heat dissipation performance while inhibiting an increase in the area of a chip is provided. In semiconductor device 1, a plurality of HBTs 20 and a plurality of diodes 30 are one-dimensionally and alternately arranged on semiconductor substrate 10. Anode electrode 36 of diode 30 is connected to emitter electrode 27 of HBT 20 via common emitter wiring 42. Diode 30 works as heat dissipating elements dissipating to semiconductor substrate 10 the heat transmitted through common emitter wiring 42 from emitter electrode 27, and also works as a protection diode connected in parallel between an emitter and a collector of HBT 20.

15 Claims, 10 Drawing Sheets (a)

(b)

TRANSISTOR WITH HEAT DISSIPATING MEANS

TECHNICAL FIELD

The present invention relates to a semiconductor device.

BACKGROUND ART

A high-frequency power amplifier (hereinafter abbreviated as PA) that is used in a mobile communication terminal such as a mobile phone is required to have a high output so that satisfactory communications are possible even at a location distant from a communication relay point.

For semiconductor devices that are used in the high-frequency power amplifier, high-output semiconductor devices (power transistors) employing a plurality of semiconductor elements having as a fundamental unit a III-V group compound semiconductor type metal semiconductor field effect transistor (hereinafter abbreviated as MESFET) or an element called an HEMT (high electron mobility transistor (hereinafter abbreviated as HEMT)) having improved high-frequency characteristics and noise characteristics of the MESFET (hereinafter referred to as FET with MESFET and HEMT in combination in some cases), or hetero-junction bipolar transistor (hereinafter abbreviated as HBT) are used.

Meanwhile, in the mobile terminal, an improvement in function and a reduction in price are in progress, and for the PA in the terminal, demands for a reduction in size and a reduction in price are high. For such a PA for a mobile terminal, a PA with the aforementioned high power semiconductor device formed into an IC is required, and a hybrid integrated circuit (HIC) and a monolithic microwave integrated circuit (MMIC) are used.

As a semiconductor element, the HBT is particularly suitable for applications to a power amplifier for a mobile terminal for which a reduction in size and a reduction in price are strongly required, since the HBT has a high output current density, is advantageous for reduction of the chip area, and can be operated with a single power supply as compared to the FET, and for recently for semiconductor elements for use in the high-frequency power amplifier, those using the HBT are mainstream.

On the other hand, the HBT has an increased heat generation density of the element due to its high output current density. Therefore, the performance of the HBT operating with high power is significantly limited by power consumed in the semiconductor device equipped with the HBT. In the HBT, the temperature of the element rises due to self-heating and the collector current increases with a rise in temperature. A positive feedback phenomenon in which the increase in the collector current incurs a further rise in temperature of the semiconductor element occurs, leading ultimately to a thermal runaway in some cases.

For prevention of the thermal runaway, the current is stabilized normally by inserting a resistance called a ballast resistance in series with an emitter or a base. However, there is a problem of degrading electric characteristics if the value of the ballast resistance is high.

Furthermore, in the case of the FET, the mobility drops if the channel temperature rises due to self-heating of the semiconductor element. Consequently, mutual conductance $g_m$ decreases, and a decrease in $g_m$ causes an increase in on-resistance. Due to the increase in on-resistance, a problem of degradation of the output power and efficiency arises.

For obtaining a high output power, it is necessary to increase the gate width for the FET and the emitter area for the HBT. If the gate width or the emitter area is simply increased, various problems of degrading the output efficiency, increasing the chip area, and so on, and therefore a large number of semiconductor elements as fundamental units are arranged side by side at certain intervals and operated in parallel. The semiconductor elements as fundamental units may include two or more semiconductor elements as a unit, and therefore the semiconductor element as a fundamental unit will be hereinafter referred to as a unit semiconductor element. In this connection, this embodiment is described based on the premise that the unit semiconductor element is constituted by one semiconductor element for simplification of explanations.

A semiconductor device of multi-cell structure using a plurality of unit semiconductor elements may have unit semiconductor elements arranged in one row or the form of a matrix of n lines and m rows.

When a large number of unit semiconductor elements are arranged, a unit semiconductor element situated at the central part is subject to a greater increase in temperature by thermal coupling effect from other unit semiconductor elements compared to a unit semiconductor element situated at the peripheral part, in addition to an increase in temperature by self-heating. Thus, the unit semiconductor element at the central part of the multi-cell structure has a temperature higher than that of the unit semiconductor element at the peripheral part of a semiconductor substrate, and a temperature unbalance occurs to cause a problem of degrading electric characteristics, and further, in the HBT, there is a problem of being susceptible to a thermal runaway by positive feedback of generated heat. Accordingly, for the high-output power semiconductor device, a development of a structure for efficiently dissipating generated heat of the semiconductor element is urgent, and various methods have been previously proposed.

As one of the methods, a method of reducing the thickness of a substrate has been proposed. According to this method, a path in which heat generated in the semiconductor element passes through a substrate to the back surface of the substrate can be shortened, thus making it possible to reduce the heat resistance of the path.

However, the method of reducing the thickness of a substrate has a problem of degradation of the mechanical strength of a chip. For example, when a compound semiconductor having relatively small thermal conductivity, such as GaAs, is used as a substrate, the thermal resistance cannot be reduced effectively unless the thickness of the substrate is reduced to 50 μm or less, but the mechanical strength of a chip is not sufficiently with such a thin substrate.

In contrast to this, Japanese Patent Laid-Open No. 8-279562 discloses a semiconductor device capable of reducing the heat resistance by a different method. The semiconductor device described in the document will be described with reference to FIG. 14. Semiconductor device 100 comprises a plurality of HBTs and a plurality of via holes 102 provided in adjacent to the HBTs. Furthermore, emitter electrode 104 of each HBT is connected to via hole 102 through air bridge wiring 106. In semiconductor device 100, a part of heat generated in the HBT is dissipated through air bridge wiring 106 and via hole 102 to PHS 108 provided on the back surface of the substrate.

Patent Document 1: Japanese Patent Laid-Open No. 8-279562

Patent Document 2: Japanese Patent Laid-Open No. 11-274381

SUMMARY OF THE INVENTION

Problems to be Solved by the Invention

However, in the semiconductor device of FIG. 14, a large number of via holes extending through a substrate having a thickness of 30 μm are provided, generated heat from the emitter is dissipated to the PHS, and therefore heat dissipation is sufficiently performed. However, for forming a via hole, it is necessary to form an opening having an area (normally several tens of μm square) much larger than the area of an emitter electrode as apparent from FIG. 14, and there is a problem of increasing the area of the chip. When via holes are placed close to each unit semiconductor element, the semiconductor device is required to have a very large area only for providing via holes, leading to an increase in the area of the chip of the semiconductor device. Further, there were cases where when a large number of via holes were placed close to a large number of unit semiconductor elements, the mechanical strength of a chip with a substrate having a thickness of 30 μm further decreased.

Japanese Patent Laid-Open No. 11-274381 discloses a different method of reducing the thermal resistance without using via holes. The semiconductor device described in the document will be described using FIG. 15. Semiconductor device 120 comprises a plurality of HBTs, and a plurality of heat dissipation plates 126 connected to emitter electrodes 122 of the HBTs via air bridge wiring 124. These heat dissipation plates 126 are made of a metal, and provided in semi-insulating semiconductor layer 130 via insulating film 128. In semiconductor device 120, a part of heat generated in the HBT is transmitted to heat dissipation plate 126 through air bridge wiring 124 and dissipated from heat dissipation plate 126 to the substrate.

However, in the semiconductor device of FIG. 15, an insulating region is formed for insulating the heat dissipation plate connected to the emitter electrode and the collector of the unit semiconductor element. When this insulating region is formed, it is necessary to take a margin in terms of a process between the insulating region and the collector electrode. Further, it is necessary to take a margin when forming the heat dissipation plate on the insulating region. In the case of GaAs, for example, a leak current tends to increase as a spacing of the insulating region decreases as shown in FIG. 18, and a margin of about 10 μm is required in, for example, the 3V operation. In view of these facts, the method is not suitable for downsizing of the chip, since a distance between the collector electrode and the heat dissipation plate increases.

The present invention has been made in view of the situations described above, and its object is to provide a semiconductor device having sufficiently high heat dissipation performance while inhibiting an increase in the area of a chip.

Means for Dissolving the Problems

The present invention is a semiconductor device characterized by comprising:

a plurality of unit semiconductor elements formed on a semiconductor substrate;

a plurality of conductive layers constituting the unit semiconductor elements; and heat dissipating means for dissipating heat generated in the unit semiconductor elements, wherein the heat dissipating means has at least one end connected to a wiring extending from electrodes of the unit semiconductor elements.

The semiconductor device is characterized in that the heat dissipating means is formed between adjacent unit semiconductor elements or that the semiconductor device has two or more semiconductor devices adjacent to the unit semiconductor element, and the heat dissipating means is placed between the unit semiconductor element and any one of the two or more semiconductor devices.

Further, the semiconductor device is characterized in that the heat dissipating means is formed on the end surface on the peripheral part side of a plurality of unit semiconductor elements formed on the semiconductor substrate with a certain arrangement.

The semiconductor device is characterized in that the wiring interconnects electrodes having a same function in the plurality of unit semiconductor elements, and one of a plurality of conductive layers constituting the unit semiconductor elements, or a conductive layer formed in a step same as a step of forming one of the plurality of conductive layers and provided separately from one of the plurality of conductive layers is connected to the other end of the heat dissipating means.

Furthermore, the semiconductor device may be characterized in that the semiconductor substrate is a semi-insulating substrate, and the heat dissipating means is a region connecting the wiring and the semi-insulating substrate; the wiring may be formed on an insulating film covering the unit semiconductor elements and the heat dissipating means and connected to electrodes constituting the unit semiconductor elements and the heat dissipating means via an opening provided on the insulating film; and further, the wiring preferably interconnects electrodes having a same function in a plurality of unit semiconductor elements.

The insulating film preferably has a relative dielectric constant of 3.0 or less, and may be a porous film.

For the area of a region on the semiconductor substrate provided with heat dissipating means, the area of a region provided with heat dissipating means situated at a relatively central part of a plurality of semiconductor elements is preferably greater than the area of a region provided with heat dissipating means situated at a relatively peripheral part of a plurality of semiconductor elements. Consequently, inter-cell thermal coupling effect with unit semiconductor elements at a central part having a particularly elevated temperature due to the influence of thermal coupling effect can be reduced, thus making it possible to uniform the junction temperature and the current density among a plurality of unit semiconductor elements.

Further, the heat dissipating means preferably electrically insulates between the wiring and the conductive layer with a voltage applied to the unit semiconductor element.

In this semiconductor device, heat generated in the unit semiconductor elements is not only dissipated from the unit semiconductor elements directly to the semiconductor substrate, but also flowed through the wiring to the heat dissipating means, and dissipated to the semiconductor substrate via the heat dissipating means. Consequently, this semiconductor device has high heat dissipation performance. Moreover, unlike the case where heat is dissipated through via holes as in the semiconductor device described with FIG. 14, an increase in the chip area can be inhibited.

The semiconductor device is characterized in that the unit semiconductor element of the present invention is a bipolar element or a hetero-bipolar element.

When the unit semiconductor element is a bipolar element, one of a plurality of conductive layers constituting bipolar elements, or a conductive layer formed in a step same as a step of forming one of a plurality of conductive layers constituting the bipolar elements and provided separately from one of the plurality of conductive layers is preferably connected to the other end of the heat dissipating means, and the conductive layer is preferably a sub-collector layer of the bipolar element, or a conductive layer formed in a step same as a step of forming the sub-collector layer and provided separately from the sub-collector layer.

The heat dissipating means is preferably formed at least between bipolar elements or between the bipolar element and one of adjacent bipolar elements.

The heat dissipating means may be provided on the end surface on the peripheral part side of a bipolar element situated at the peripheral part of a plurality of bipolar elements.

The heat dissipating means preferably electrically insulates between the wiring and the conductive layer with a voltage applied to the bipolar element.

A plurality of bipolar elements are continuously arranged in a certain direction, the heat dissipating means is formed at least between bipolar elements or between the bipolar element and one of the adjacent bipolar elements, one of conductive layers constituting bipolar elements, or a conductive layer formed in a step same as a step of forming one of a plurality of conductive layers constituting bipolar elements and provided separately from one of the plurality of conductive layers is preferably formed so as to extend in a direction perpendicular to the certain direction arranged said plurality of bipolar elements, and the electrode is preferably an emitter electrode of the bipolar element.

The wiring preferably interconnects emitter electrodes of a plurality of bipolar elements.

The wiring is preferably formed on an insulating film covering the bipolar element and the heat dissipating means, and connected to the electrodes of the bipolar elements and one end of the heat dissipating means via an opening provided on the insulating film.

Further, the electrode may be an emitter electrode of the bipolar element, the conductive layer may be a sub-collector layer of the bipolar element, or a conductive layer formed in a step same as a step of forming the sub-collector layer constituting the bipolar element and provided separately from the sub-collector layer, and the heat dissipating means formed between the wiring and the sub-collector layer of the bipolar element, or a conductive layer formed in a step same as a step of forming the sub-collector layer constituting the bipolar element and provided separately from the sub-collector layer may be a diode. If the heat dissipating means is a diode, this diode may have a function as a protection diode against insulation breakdown when a negative electric field is applied to a collector of a bipolar transistor and a positive electric field is applied to an emitter. The diode element is preferably a p-n junction diode or a Schottky junction diode.

The p-n junction diode is preferably formed of a collector layer and a base layer of the bipolar element, and a metal electrode may be formed on the base layer.

The Schottky junction diode is formed of a collector layer of the bipolar element and a metal layer formed on the collector layer and forming a Schottky junction with the collector layer, the Schottky junction diode has a metal electrode, and the metal layer of the metal electrode on a side of contact with the collector layer is preferably a metal forming a Schottky junction with the collector layer.

The metal layer forming a Schottky junction with the collector layer may be a wiring, and at least the metal layer of the wiring on a side of contact with the collector layer may be a metal forming a Schottky with the collector layer.

For the heat dissipating means of the present invention, the conductive layer may be a sub-collector layer of the bipolar element, or a conductive layer formed in a step same as a step of forming the sub-collector layer and provided separately from the sub-collector layer, the heat dissipating means may be a capacitance composed of a dielectric layer held between the wiring and the sub-collector layer or the conductive layer provided separately from the sub-collector layer and the wiring, and further, the dielectric layer may be an insulating layer covering the bipolar element and the sub-collector layer.

A plurality of bipolar elements may be continuously arranged in a certain direction, and at least the wiring may be formed so as to extend in a direction perpendicular to the certain direction in a region on which the capacitance is formed, and further, the sub-collector layer may be formed so as to extend in a direction perpendicular to the certain direction so as to face the wiring.

The semiconductor substrate may be a semi-insulating substrate and comprise a back surface metal film formed on the back surface of the semi-insulating substrate, a hole puncturing through the semi-insulating substrate, and a metal buried in the hole, the heat dissipating means may be a metal film formed on the semi-insulating substrate, and the metal film and the back surface metal film may be connected to the metal buried in the hole.

Further, for the area of a region on the semiconductor substrate provided with heat dissipating means, the region provided with the heat dissipating means situated at a relatively central part of a plurality of semiconductor elements preferably has a large area compared to the region provided with the heat dissipating means situated at a relatively peripheral part of a plurality of semiconductor elements.

One of conductive layers constituting the bipolar elements, or a conductive layer formed in a step same as a step of forming one of the conductive layers constituting unit semiconductor elements and provided separately from one of the plurality of conductive layers is preferably connected to the other end of the heat dissipating means, and the heat dissipating means may be an electrode constituting the unit semiconductor element. In this case, preferably, the unit semiconductor element is an FET, and the electrode is a source electrode and/or a drain electrode.

Source electrodes of a plurality of FETs are interconnected by a wiring, the area of source electrodes situated at a relatively central part of the plurality of FETs is preferably greater than the area of source electrodes situated at a relatively peripheral part of a plurality of semiconductor elements, and the wiring is preferably connected to the source electrodes.

Further, for a plurality of heat dissipating means provided on the semiconductor substrate, those situated at a relatively central part preferably have a larger contact area with the semiconductor substrate or an epitaxial layer than those situated at a relatively peripheral part, and consequently, the heat interference with unit semiconductor elements at the central part having an elevated temperature due to the influence of heat interference can be reduced, thus making it possible to uniform the junction temperature and the current density among a plurality of unit semiconductor elements.

When the insulating film provided between the unit semiconductor element and the heat dissipating means is formed so as to cover the unit semiconductor element and the heat dissipating means, the insulating film preferably has a relative dielectric constant of 3.0 or less because a stray capacitance formed by the wiring decreases, and further, the insulating film may be a porous film.

In the semiconductor device of the present invention, heat generated in unit semiconductor elements is transmitted through a wiring to heat dissipating means, and heat is dissipated from the heat dissipating means to the semiconductor substrate. This heat dissipating means has a function of electrically insulating the wiring from the substrate, and it is not necessary to provide an insulating region leading to an increase in the area of a chip as in the conventional technique. Thus, the semiconductor device according to the present invention has high heat dissipation performance, and can inhibit an increase in the area of a chip. Here, the words "electrically insulating the wiring from the substrate" mean that the heat dissipating means connected between the wiring and a conductor forming the unit semiconductor element dissipates heat from the wiring to the back surface of the substrate via the conductive layer with a voltage applied to the unit semiconductor element, and in electrically, a non-conducting state is created between the wiring and the conductive layer. For example, when the heat dissipating means is a diode, voltages in opposite direction are applied to the diode, and therefore little electric current passes if a voltage exceeding a withstanding voltage is not applied. When the heat dissipating means is a capacitance, an electric current does not pass through the capacitance with a voltage applied to the unit semiconductor element.

Effects of the Invention

According to the present invention, a semiconductor device having sufficiently high heat dissipation performance while inhibiting an increase in a chip area is achieved.

Figure 1:
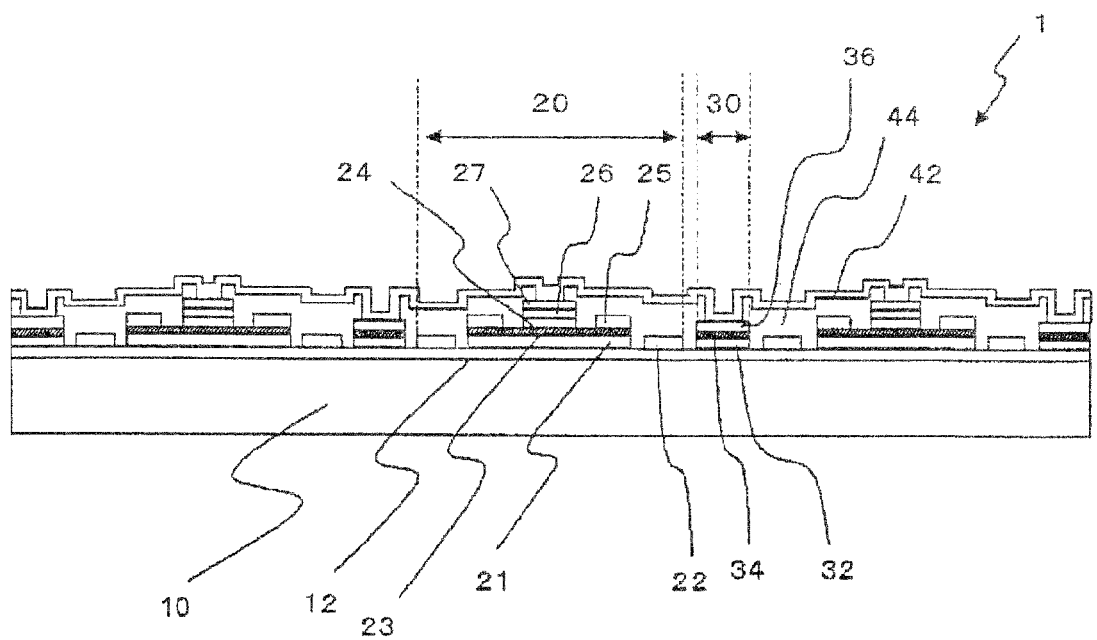
FIG. 1 is a schematic cross-sectional view showing a first embodiment of a semiconductor device according to the present invention.

DESCRIPTION OF SYMBOLS 1 semiconductor device
1$a$ semiconductor device
2 semiconductor device
2$a$ semiconductor device
2$b$ semiconductor device
10 semiconductor substrate
12 sub-collector layer
20 HBT
21 collector layer
22 collector electrode
23 base layer
24 emitter layer
25 base electrode
26 cap layer
27 emitter electrode
30 diode
32 n type layer
34 p type layer
36 anode electrode
42 wiring
44 insulating film
50 diode
52 n type layer
54 Schottky electrode
60 heat dissipating means
62 metal film
62$a$ metal film
62$b$ metal film
62$c$ metal film
74 pad
80 via hole
82 pad
90 gate electrode
91 drain electrode
92 source electrode
93 insulating film 94 wiring
95 active layer
96 semiconductor substrate

BEST MODE FOR CARRYING OUT THE INVENTION

Preferred embodiments of semiconductor devices according to the present invention will be described in detail with reference to the drawings. In this connection, the semiconductor devices mentioned herein include high-output power semiconductor devices and semiconductor integrated circuit devices formed into an integrated circuit such as an MMIC including high-output power semiconductor devices. Furthermore, in descriptions of the drawings, same symbols are given to same components, and redundant explanations are omitted.

First Embodiment

Figure 2:
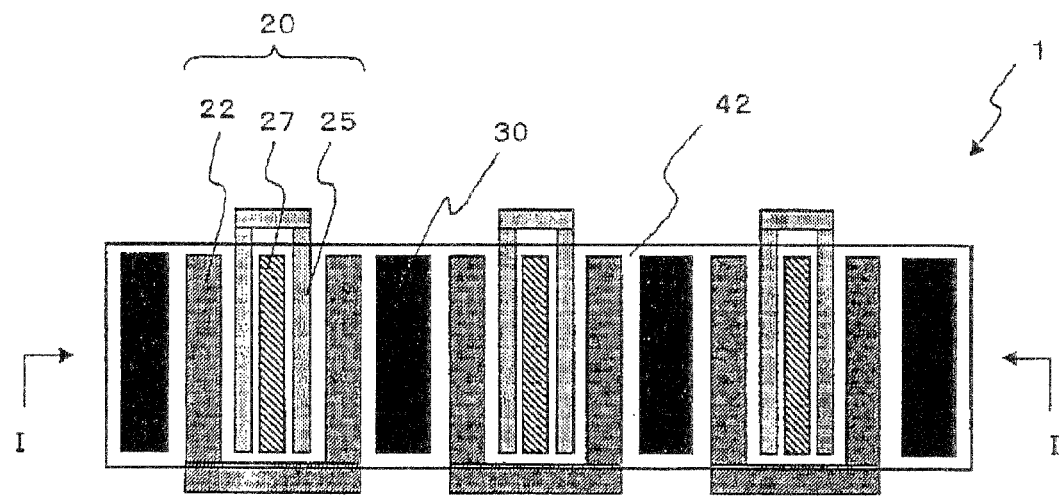
FIG. 2 is a schematic plan view showing the first embodiment of the semiconductor device according to the present invention.

FIG. 1 is a sectional view showing a first embodiment of the semiconductor device according to the present invention. FIG. 2 is a plan view showing the first embodiment of the semiconductor device according to the present invention. FIG. 1 shows a cross-section taken along line I-I of FIG. 2.

Semiconductor device 1 of this embodiment is so called a high-output power semiconductor device of multi-cell structure having a plurality of n-p-n type HBTs formed on a semi-insulating semiconductor substrate. This embodiment is described with an example of using a semi-insulating semiconductor substrate as a semiconductor substrate, but an n type semiconductor substrate may be used or a p-n-p type HBT may be used as a matter of course.

Semiconductor device 1 shown in FIG. 1 comprises sub-collector layer 12 formed on the (001) plane of semi-insulating semiconductor substrate 10, HBTs 20 as unit semiconductor elements one-dimensionally and alternately arranged on sub-collector layer 12, and p-n junction diodes 30 as heat dissipating means. A collector of the HBT is consisted of collector layer 21 formed on sub-collector layer 12 and collector electrodes 22 formed at both sides of collector layer 21 on sub-collector layer 12. Base layer 23 is formed on each collector layer 21. Emitter layer 24 is formed on base layer 23, and base electrodes 25 are formed at both sides of emitter layer 24 on base layer 23. Further, on emitter layer 24, cap layer 26 and emitter electrode 27 are stacked in this order. The size (area in a plane parallel to the surface of semiconductor substrate 10) of emitter electrode 27 was set to 3 μm×20 μm.

In this connection, sub-collector layer 12 is a layer of which the impurity concentration is set to higher than that of the collector layer for making it easy to make ohmic contact.

Further, in this embodiment, diode 30 is placed between mutually adjacent two HBTs 20 of a plurality of HBTs 20 and at opposite ends in a direction along which HBTs 20 are arranged (horizontal direction in the figure) on sub-collector layer 12. Consequently, HBTs 20 and diodes 30 are alternately arranged along the arrangement direction described above. In this connection, diode 30 may be placed at least on one side of each HBT 20.

Collector electrode 22 forms an ohmic contact with sub-collector layer 12, base electrode 25 forms an ohmic contact with base layer 23, and emitter electrode 27 forms an ohmic contact with cap layer 26. In this connection, in this embodiment, a ballast resistor formed in series with an emitter or a base is omitted, but the ballast resistor may appropriately be formed as necessary as a matter of course.

The heat dissipating means is p-n junction diode 30 formed of n type layer 32 formed on sub-collector layer 12, p type layer 34 formed on n type layer 32, and anode layer 36 formed on p type layer 34. In this embodiment, heat dissipating means 30 can be fabricated in the same process forming the HBT, since n type layer 32 is composed of a layer same as collector layer 21 of the HBT, p type layer 34 is composed of a layer same as base layer 23 of the HBT, and anode electrode is composed of a metal same as the metal of the base electrode of the HBT. The size (area in plane parallel to the surface of substrate 10) of diode 30 was set to 5 μm×20 μm.

HBT 20 is constituted by collector layer 21, collector electrode 22, base layer 23, emitter layer 24, base electrode 25, cap layer 26 and emitter electrode 27. Here, one example of combinations of materials of layers used in this embodiment is shown, but of course, other conditions may be used without any problems.

Sub-collector layer 12: GaAs (n type)
  impurity concentration: $3 \times 10^{18}/cm^3$
  thickness: 500 nm
Collector layer 21: GaAs (n type)
  impurity concentration: $3 \times 10^{16}/cm^3$
  thickness: 700 nm
Collector layer 22: AuGe/Ni/Au
  thickness: 50/50/300 nm
Base layer 23: GaAs (p type)
  impurity concentration: $4 \times 10^{19}/cm^3$
  thickness: 80 nm
Emitter layer 24: AlGaAs (n type)
  impurity concentration: $5 \times 10^{17}/cm^3$
  thickness: 150 nm
Base electrode 25: Ti/Pt/Au
  thickness: 50/50/100 nm
Cap layer 26: InGaAs (n type)
  impurity concentration: $2 \times 10^{19}/cm^3$
  thickness: 100 nm
Emitter electrode 27: WSi
  thickness: 200 nm
Insulating film 44: silicon dioxide film ($SiO_2$)
  thickness: 1000 nm In this connection, sub-collector layer 12 is a layer of which the impurity concentration is increased for forming an ohmic contact with the collector electrode.

Insulating film 44 is formed so as to cover HBT 20 and diode 30, and common emitter wiring 42 connecting each emitter is formed. Common emitter wiring 42 is connected to anode electrode 36 of diode 30 via opening formed on insulating film 44 on diode 30.

Since the HBT of this embodiment is an n-p-n type HBT, negative voltage is applied to emitter electrode 27 and a positive voltage is applied to collector electrode 22. Therefore, a positive voltage is applied to n type layer 32 via anode electrode 36 of diode 30 and a negative voltage is applied to p type layer 34. As a result, since reverse bias is applied to diode 30, wiring 42 and sub-collector layer 12 are thermally conducted and electrically insulated. In this connection, Au was used as a material of wiring 42.

A silicon dioxide film was used for insulating film 44, but instead of the silicon dioxide film, a silicon nitride film, an SiON film, an SiOC film, an aluminum nitride film, benzocyclobutene (BCB), a hydrogenated silsesquioxane (HSQ) film, an alkyl silsesquioxane (MSQ) film, a hydrogenated alkyl silsesquioxane (HOSP) film or the like may be used. Furthermore, these materials may be used in combination to form an insulating film consisting of two or more layers as a matter of course. The heat flows partially from emitter electrode 27 to common emitter wiring 42. A part of transmitted heat is dissipated to semiconductor substrate 10 via insulating film 44 contacting common emitter wiring 42.

Further, diode 30 works as heat dissipating means dissipating heat to semiconductor substrate 10 transmitted through common emitter wiring 42 from emitter electrode 27. Further, since n type layer 32 is connected with collector layer 21 of the HBT 20 via sub-collector layer 12, diode 30 works also as a protection diode connected in parallel between the emitter and the collector of HBT 20.

Since collector electrode 22 of the HBT and n type layer 32 of diode 30 have the same voltage. Therefore in this embodiment, no problem arises even if a spacing between collector electrode 22 and n type layer 32 of diode 30 is small, it is not necessary to take a margin for the position by a large amount even if diode 30 as heat dissipating means is formed, thus making it possible to reduce a chip area. Next, a heat flow path of semiconductor device 1 will be described using FIG. 3.

Figure 3:
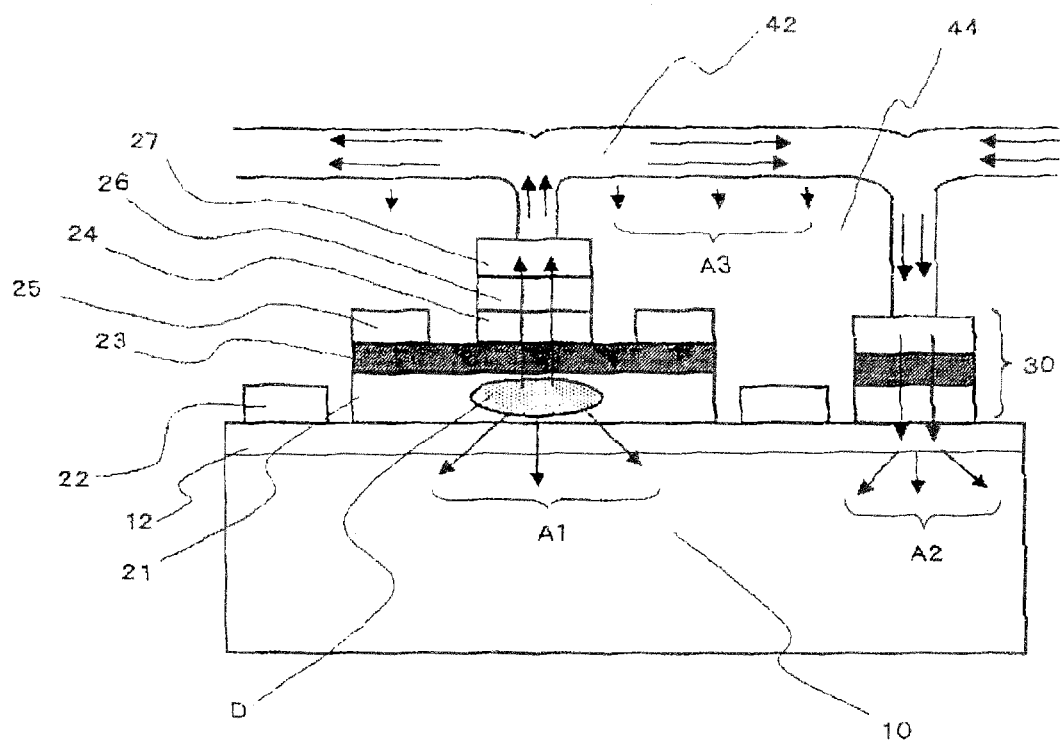
FIG. 3 is a view for explaining an effect of semiconductor device 1.

FIG. 3 is a view schematically showing the flow of heat in semiconductor device 1. As shown in FIG. 3, HBT 20 mainly generates heat at region D near a junction between the base and the collector. The generated heat is dissipated from HBT 20 directly to semiconductor substrate 10 (see arrow A1), and also transmitted to diode 30 through common emitter wiring 42. Electrically, common emitter wiring 42 and collector layer 12 are insulated by diode 30, but thermally, the wiring and collector layer 12 are coupled, and therefore heat from emitter electrode 27 is dissipated to semiconductor substrate 10 via common emitter wiring 42 and diode 30 (see arrow A2).

In this connection, the heat dissipated to semiconductor substrate 10 is dissipated to the back surface side of semiconductor substrate 10 having a low temperature, and dissipated to outside the semiconductor device via a heat dissipating material provided on the backside of the semiconductor device as a matter of course. Normally, the heat dissipation is often achieved by sticking the backside of the semiconductor device onto a heat sink of a semiconductor package. For sticking the semiconductor device onto the heat sink of the semiconductor package, an alloy, such as gold-silicon alloy, gold-germanium alloy or gold-tin alloy, is often used, but other materials may be used as a matter of course.

In this embodiment, common emitter wiring 42 is not connected directly to semiconductor substrate 10, but only connected to the substrate via an n type layer having a thickness of 1200 nm and a p type layer having a thickness of 80 nm. Therefore, the thickness is negligible when compared to the thickness of the semiconductor substrate, i.e. 50 μm, and heat is efficiently dissipated to the substrate as compared to a conventional technique in which the wiring is connected to the semiconductor substrate via an insulating film.

In this connection, in this embodiment, a structure in which an area between the diode for heat dissipating and the HBT is etched away to the substrate may be employed as a matter of course, and this structure does not impair the heat dissipation performance of the present invention.

Particularly in this embodiment, insulating film 44 is provided between HBT 20 and diode 30, and common emitter wiring 42 is formed in contact with insulating film 44. Therefore, heat generated in HBT 20 is also transmitted from common emitter wiring 42 to insulating film 44 (see arrow A3), and dissipated from insulating film 44 to semiconductor substrate 10. Consequently, the heat dissipation performance of semiconductor device 1 is further improved.

In this connection, if common emitter wiring 42 is an air bridge wiring, an effect of heat dissipation in case of common emitter wiring 42 in contact with insulating film 44 is lost, but since heat is dissipated via diode 30, common emitter wiring 42 can be formed into an air bridge wiring.

In this connection, diode 30 is used for all heat dissipating means in this embodiment, but combination with other heat dissipating means described later is also possible as a matter of course.

When a material having a dielectric constant lower than that of a conventional silicon dioxide film (having a relative dielectric constant of 3.9 to 4.5) or the like, so called low-K material, is used as insulating film 44, a parasitic capacitance generated in insulating film 44 can sufficiently be reduced. Specifically, the relative dielectric constant of insulating film 44 is preferably 3.0 or less. Such low-K materials include, for example, SiOC, BCB, HSQ, MSQ and HOSP.

When a porous film is used as insulating film 44, insulating film 44 having a low dielectric constant can easily be achieved. Insulating films capable of providing such a porous film include, for example, SiOC and MSQ.

In this embodiment, an example in which sub-collector layer 12 is continuously formed below a region on which the wiring of FIG. 2 is formed, but sub-collector layer 12 may be formed only on unit semiconductor element region 20 and diode region 30 on which the p-n junction diode is formed. In this embodiment, sub-collector layer 12, composed of n type GaAs, collector layer 21 composed of n type GaAs, base layer 23 composed of p type GaAs, emitter layer 24 composed of n type AlGaAs and cap layer 26 composed of n type InGaAs are formed in this order on semiconductor substrate 10 composed of semi-insulating GaAs using an epitaxial growth method, followed by shaping these layers to each form by a photolithography method and an etching method.

In FIG. 1, sub-collector layer 12 in unit semiconductor element region 20 and diode region 30 on which the p-n junction diode is formed is not separated, but even if the sub-collector layer between unit semiconductor element region 20 and diode region 30 on which the p-n junction diode is formed is removed, no problem arises as a matter of course.

As described above, sub-collector layer 12 is removed using an etching method, and therefore in this embodiment, an epitaxial layer for use in the p-n junction diode can be formed using sub-collector layer 12, collector layer 21 and base layer 23 formed on the substrate. Therefore, it is not necessary to grow the epitaxial layer for use in the p-n junction diode in a different step.

In this embodiment, anode electrode 36 is formed on base layer 23, but as long as base layer 23 and the wiring can form an ohmic contact, the wiring may be contacted directly to base layer 23 without providing anode electrode 36 as a matter of course.

Even though the sub-collector layer 12 between unit semiconductor element region 20 and diode region 30 on which the p-n junction diode is formed is removed, a positive voltage is applied to emitter electrode 27, and therefore wiring 42 and sub-collector layer 12 are thermally coupled and electrically insulated. In this connection, Au was used as a material of wiring 42.

Second Embodiment

Figure 4:
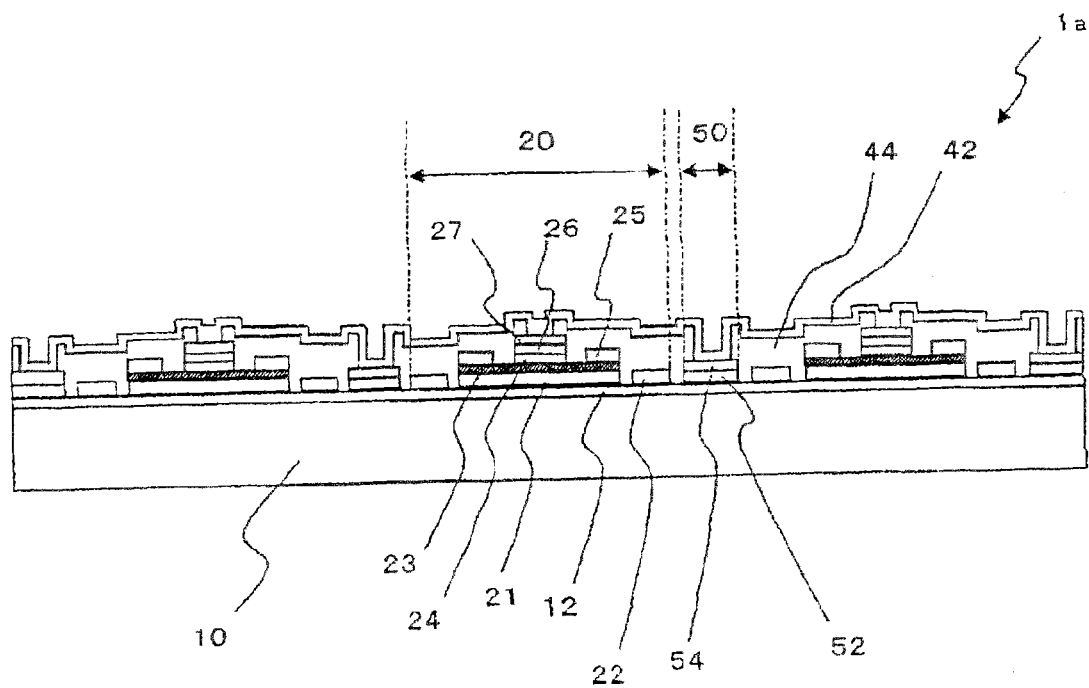
FIG. 4 is a schematic cross-sectional view showing a second embodiment of the semiconductor device according to the present invention.

FIG. 4 is a cross-sectional view showing a second embodiment of the semiconductor device according to the present invention. Semiconductor device 1a is different from semiconductor device 1 in the configuration of diode 50. Other configurations of semiconductor device 1a are same as those of semiconductor device 1. Diode 50 is a Schottky junction diode constituted by n type layer 42 and Schottky electrode 54 stacked in this order on sub-collector layer 12, and works for both the heat dissipating means and protection diode. Like n type layer 32 of FIG. 1, n type layer 52 has a composition same as that of collector layer 21 of HBT 20. Schottky electrode 54 is connected to emitter electrode 27 via common emitter wiring 42.

As a Schottky metal, a metal such as titanium, aluminum or tantalum may be used. When titanium is used as a Schottky metal, the configuration of Schottky electrode 54 may use, for example, a Ti/Pt/Au electrode.

Since the HBT of this embodiment is an n-p-n type HBT, a negative voltage is applied to emitter electrode 27 and a positive voltage is applied to collector electrode 22, and therefore a negative voltage is applied to the Schottky electrode of diode 50. Therefore, reverse bias is applied to diode 50, common emitter wiring 42 and sub-collector layer 12 are electrically insulated.

A positive voltage is applied to an electrode forming a Schottky junction with the HBT as a unit element, and therefore even if sub-collector layer 12 is etched away, no problem arises as a matter of course because common emitter wiring 42 and sub-collector layer 12 are electrically insulated.

In semiconductor device 1a, heat generated in the HBT 20 is dissipated from HBT 20 directly to semiconductor substrate 10, and also transmitted to diode 50 through common emitter wiring 42 and dissipated from diode 50 to semiconductor substrate 10. Consequently, semiconductor device 1a has high heat dissipation performance. Further, since diode 50 is provided as heat dissipating means, the flow of an excessive surge current into HBT 20 can be prevented. Consequently, semiconductor device 1a is excellent in resistance to electrostatic breakdown. Here, the Schottky junction diode has a lower turn-on voltage compared with the p-n junction diode, and therefore can be made to work especially suitably as a protection diode against dielectric breakdown.

The first and second examples show examples in which heat dissipating means is the p-n junction diode and the Schottky junction diodes respectively, but of course, other diodes, for example a PIN diode may be used instead of the p-n junction diode or the Schottky junction diode by configuring the diode so as to obtain reverse functions in a state of applying an emitter voltage and a collector voltage.

The p-n junction diode and the Schottky junction diode have an advantage that a diode can be formed without adding any other steps because layers that are used in the HBT can be used. Further, in the heat dissipating means of the first and second examples, the diode between common emitter wiring 42 and collector layer 12 is composed of a GaAs layer. Such a semiconductor film has a thermal conductivity higher by a factor of about 50 than that of an insulating film such as a silicon dioxide film, and heat from the wiring is dissipated to the substrate without passing through an insulating film such as a silicon dioxide film as in this example, thus making it possible to effectively transmit heat to the semiconductor substrate.

Third Embodiment

Figure 5:
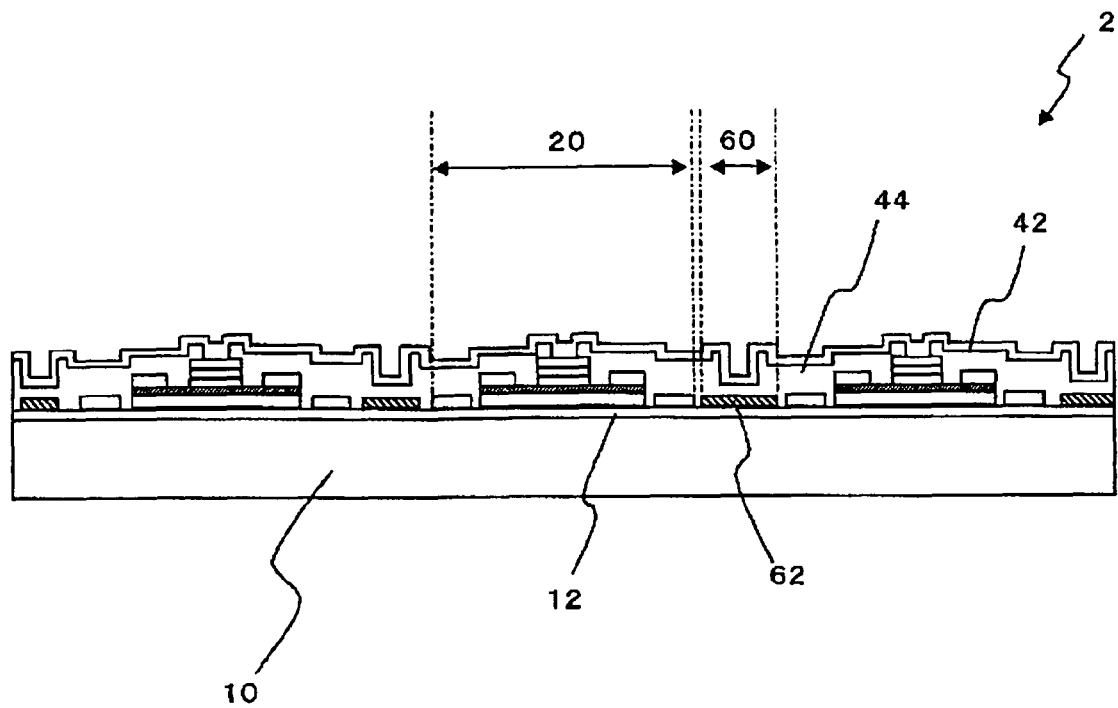
FIG. 5 is a schematic cross-sectional view showing a third embodiment of the semiconductor device according to the present invention.
Figure 6:
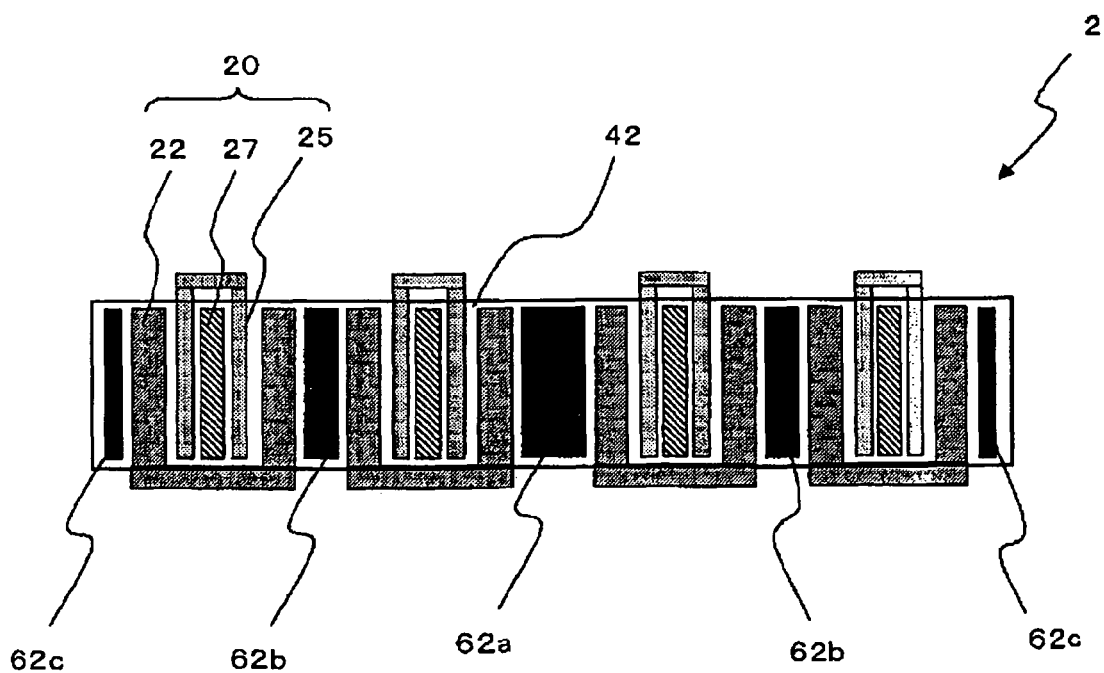
FIG. 6 is a schematic plan view showing the third embodiment of the semiconductor device according to the present invention.

FIG. 5 is a cross-sectional view showing a third embodiment of the semiconductor device according to the present invention. FIG. 6 is a plan view showing the third embodiment of the semiconductor device according to the present invention. In semiconductor device 2, a plurality of HBTs 20 and a plurality of heat dissipating means 60 are one-dimensionally alternately arranged on semiconductor substrate 10. The configuration of HBT 20 is similar to that shown in FIG. 1.

Heat dissipating means 60 is constituted by metal film 62 formed on sub-collector layer 12 and insulating film 44 on metal film 62. Insulating film 44 is similar to the insulating film shown in FIG. 1. Namely, a portion of insulating film 44 provided on metal film 62 works as a part of heat dissipating means 60. Insulating film 44 of heat dissipating means 60 is connected to emitter electrode 27 of HBT 20 via common emitter wiring 42. In other words, insulating film 44 is interposed between metal film 62 and common emitter wiring 42, and an MIM capacitor (metal insulation metal capacitor) is formed. Consequently, metal film 62 and common emitter wiring 42 are thermally coupled via insulating film 44, but electrically insulated. In this connection, the thickness of metal film 62 is, for example, 400 nm. The thickness of insulating film 44 on metal film 62 is, for example, 400 nm. In this connection, the thickness of this insulating film is designed from a viewpoint of heat and RF.

As shown in FIG. 6, in a region on semiconductor substrate 10 provided with heat dissipating means 60, metal film 62 situated at a relatively central part has a large area of contact with sub-collector layer 12 compared to metal film 62 situated at a relatively peripheral part. Specifically, the area of metal film 62 gradually increases as going from opposite end parts to the central part along a direction of arrangement of HBTs 20. In this embodiment, the area of each metal film 62 is changed by changing the length in a direction of arrangement of HBTs 20. For showing one example of the area of each metal film 62, metal film 62a closest to the central part has an area of 15 µm×20 µm, metal film 62b next closest to the central part has an area of 10 µm×20 µm, and metal film 62c closest to the peripheral part has an area of 5 µm×20 µm.

Figure 14:
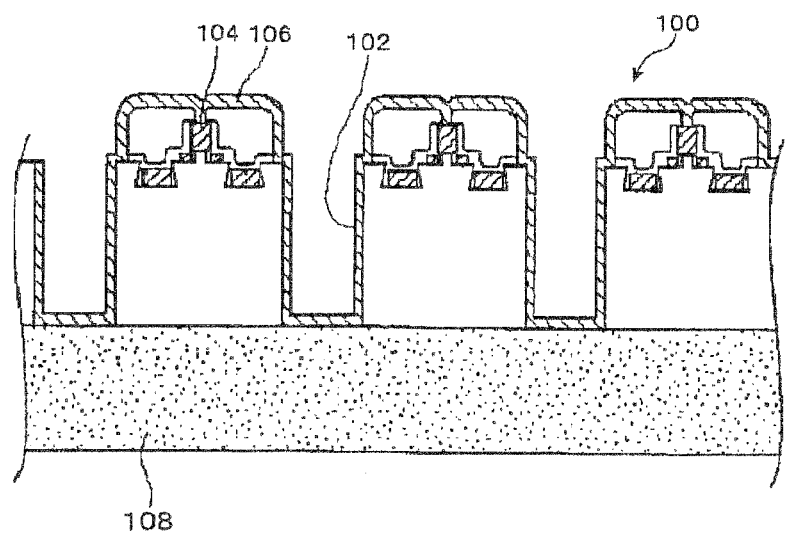
FIG. 14 is a schematic cross-sectional view showing a conventional semiconductor device.
Figure 15:
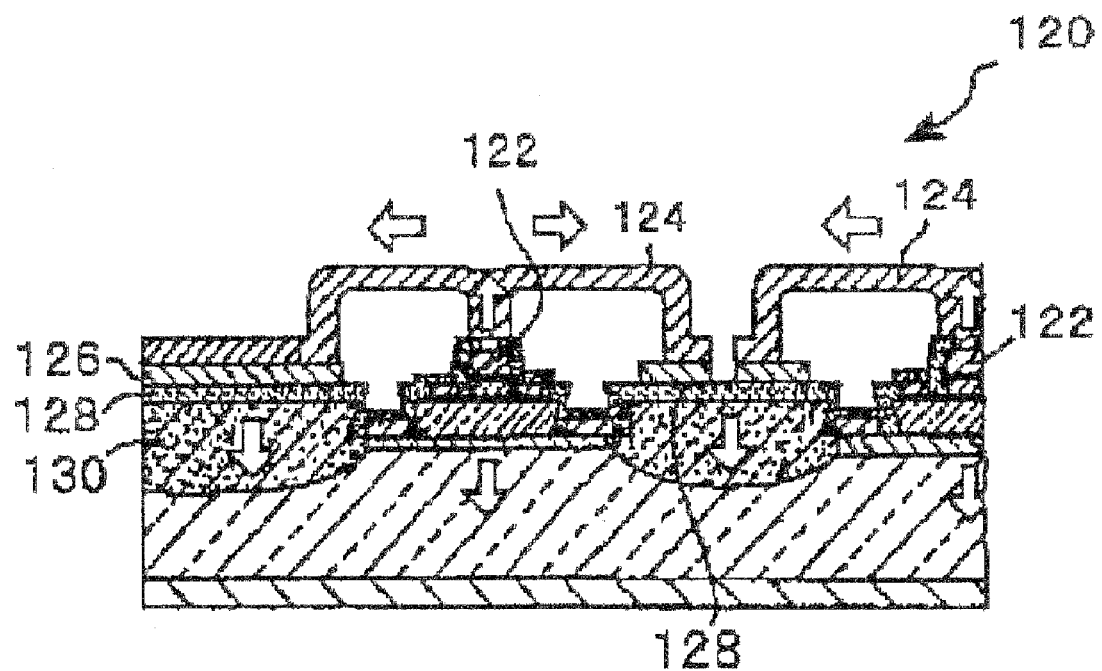
FIG. 15 is a schematic cross-sectional view showing the conventional semiconductor device.

Next, the effect of semiconductor device 2 will be described. In semiconductor device 2, heat generated in HBT 20 is dissipated from HBT 20 directly to semiconductor substrate 10, and also transmitted to heat dissipating means 60 through common emitter wiring 42 and dissipated from heat dissipating means 60 to semiconductor substrate 10. Consequently, semiconductor device 2 has high heat dissipation performance. Moreover, unlike the case where heat is dissipated through via holes as in the semiconductor device described above and shown in FIG. 14, the chip area increase can be suppressed. As described above, semiconductor device 2 having sufficiently high heat dissipation performance while inhibiting the chip area increase is achieved.

Further, for a plurality of heat dissipating means 60 provided on semiconductor substrate 10, those situated at a relatively central part have a larger area of contact with sub-collector layer 12 than those situated at a relatively peripheral part. Consequently, the efficiency of dissipation of heat from HBT 20 having a particularly elevated temperature due to the influence of thermal coupling can be improved, thus making it possible to uniform the temperature and the current density among a plurality of HBTs. Thus, degradation of performance of HBT 20 is inhibited, and semiconductor device 2 excellent in reliability is achieved. In this connection, heat dissipating means composed of a metal film and an insulating film is used in this embodiment, but other heat dissipating means may be used. For example, diodes described with FIG. 1 and FIG. 4 may be used, and the effects described above are also exhibited in this case.

In this connection, in this embodiment, sub-collector layer 12 may be separated between the region on which the capacitance is formed and the region on which the unit semiconductor element is formed as in the first embodiment and the second embodiment as a matter of course.

Furthermore, by interposing insulating film 44 between metal film 62 and common emitter wiring 42, a short circuit between the emitter and the collector of HBT 20 is prevented with an easy configuration. In contrast to this, when metal film 62 on sub-collector layer 12 and common emitter wiring 42 are electrically connected without interposing insulating film 42, it is necessary to:

1. fabricate an insulating region by ion-implantation into sub-collector layer 12; or
2. remove sub-collector layer 12, for insulating the emitter from the collector.

Either when an insulating region is provided by ion-implantation into sub-collector layer 12 or when sub-collector layer 12 is removed, it is necessary to increase the area of the insulating region or the removed sub-collector layer compared to the dimension of the metal film so that the metal film does not contact the sub-collector layer. Therefore, in the case of a multi-finger type or when unit semiconductor elements are arranged in the form of a matrix of n×m, the chip area increases. Consequently, the structure of this embodiment is more advantageous in terms of the area.

Moreover, in this embodiment, for insulating film 44 provided between HBT 20 and heat dissipating means 60, a part of insulating film 44 insulating wiring 42 from the base electrode/collector electrode is used as an insulating film of heat dissipating means 60, and therefore the number of steps of production of semiconductor device 2 is not increased. In this connection, the thickness of the insulating film of heat dissipating means 60 is not limited to 400 nm as previously illustrated by example, but may be any thickness as long as it allows metal film 62 and common emitter wiring 42 to be electrically insulated and thermally coupled. The thickness is preferably 10 to 5000 nm, more preferably 50 to 1000 nm, further preferably 100 to 500 nm.

Figure 7:
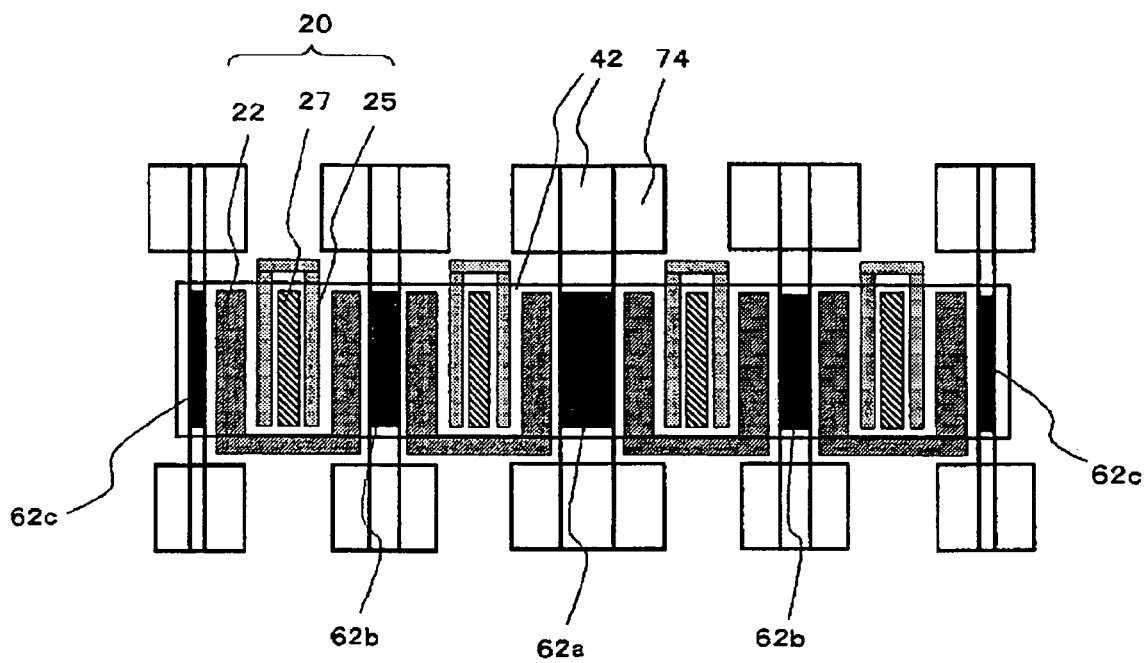
FIG. 7 is a schematic plan view for explaining an alternative example of semiconductor device 2.

In this connection, heat is dissipated from common emitter wiring 42 via insulating film 44 to metal film 62 in this embodiment, but such heat dissipation via insulating film 44 is not necessarily limited to dissipation onto metal film 62, and may be dissipation directly onto semiconductor substrate 10 (or sub-collector layer 12). Namely, as shown in FIG. 7, common emitter wiring 42 is made to extend in a direction perpendicular to a direction along which HBTs 20 are arranged in a region on which heat dissipating means 62a, 62b and 62c on semiconductor substrate 10 are formed. Heat generated in HBT 20 is dissipated to heat dissipating means 62a, 62b and 62c from common emitter wiring 42, and further diffused to common emitter wiring 42 extending upside and downside from common emitter wiring 42. Heat of common emitter wiring 42 is diffused to semiconductor substrate 10 via insulating film 44 contacting common emitter wiring 42.

Namely, heat diffused to common emitter wiring 42 can be dissipated to semiconductor substrate 10 by increasing the area of common emitter wiring 42. The end part of common emitter wiring 42a can be enlarged or connected to pad 74 as shown in FIG. 7, and the area of wiring 42 increases, thus making it possible to further reduce the heat resistance of semiconductor device 1. In this connection, in FIG. 7, a sub-collector layer 12 is formed only on a region of the wiring on which substantially the unit semiconductor element is formed as in the first and second embodiments, but may be formed so as to extend below the common emitter wiring extending upstream and downstream from common emitter wiring 42 as a matter of course, and further, the p-n junction diode or the Schottky junction diode in the first and second embodiments may be formed so as to extend below the common emitter wiring extending upstream and downstream from common emitter wiring as shown in FIG. 8 described later as a matter of course.

Fourth Embodiment

Figure 8:
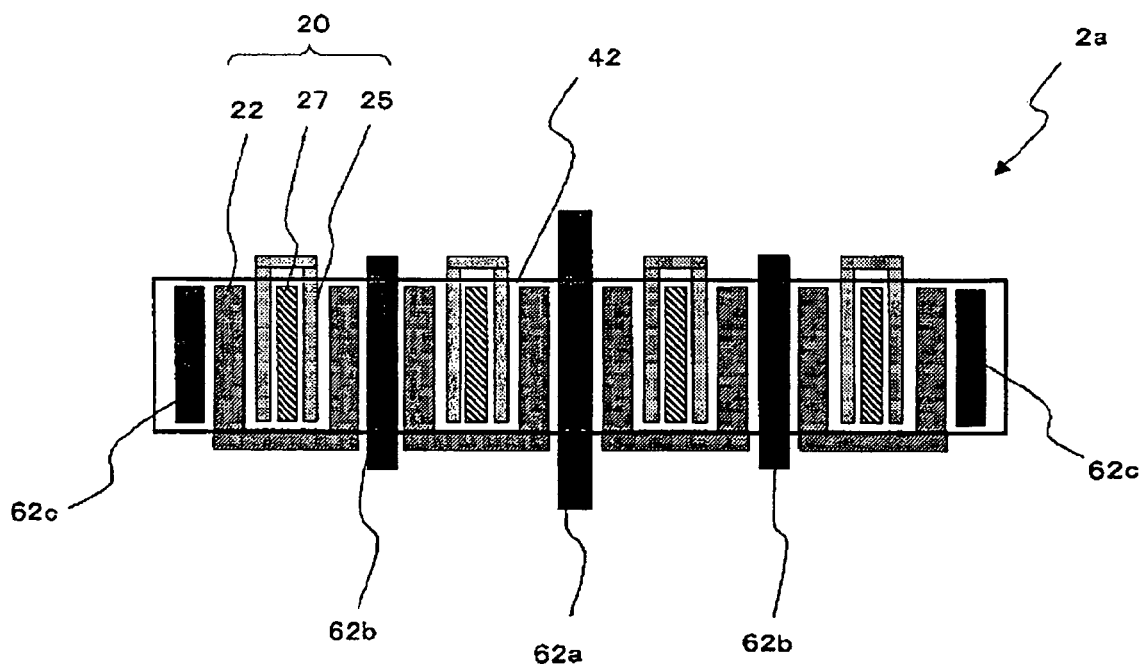
FIG. 8 is a schematic plan view showing a fourth embodiment of the semiconductor device according to the present invention.

FIG. 8 is a plan view showing a fourth embodiment of the semiconductor device according to the present invention. In semiconductor device 2a, a plurality of HBTs 20 and a plurality of heat dissipating means 60 are one-dimensionally and alternately arranged. In addition, in the region on semiconductor substrate 10 where heat dissipating means 60 is provided, metal film 62a situated at a relatively central part has a larger area of contact with sub-collector layer 12 compared to metal films 62b and 62c situated at a relatively peripheral part (equal in width but different in length) as in semiconductor device 2. This embodiment is different from semiconductor device 2 in a sense that the area of each metal film 62 is changed by changing the length in a direction perpendicular to a direction along which HBTs 20 are arranged.

In FIG. 8, the sub-collector layer 12 is made to extend in a direction perpendicular to a direction along which metal films 62a, 62b and 62c are continuously arranged so that sub-collector layer 12 is connected to metal films 62a, 62b and 62c.

In the case of FIG. 8, the area of the metal film as heat dissipating means at the central part of the wiring is larger than at a peripheral part, but the spacing between unit semiconductor elements is the same. In this case, the area of a portion where metal films 62a and 62b is connected to common emitter wiring 42 is same as the area of a portion where metal film 62c having the smallest area is connected to common emitter wiring 42, and even if the metal film is partly connected to the semiconductor substrate, a heat dissipation effect similar to that when the metal film is connected to the sub-collector layer 12 is exhibited as a matter of course. In this connection, in this embodiment, the structure of the heat dissipating means of the embodiments described previously may be used as a matter of course.

In semiconductor device 2a having the configuration described above, high heat dissipation performance can be achieved, and the temperature and the current density among a plurality of HBTs can be uniformed as in semiconducter device 2.

Fifth Embodiment

Figure 9:
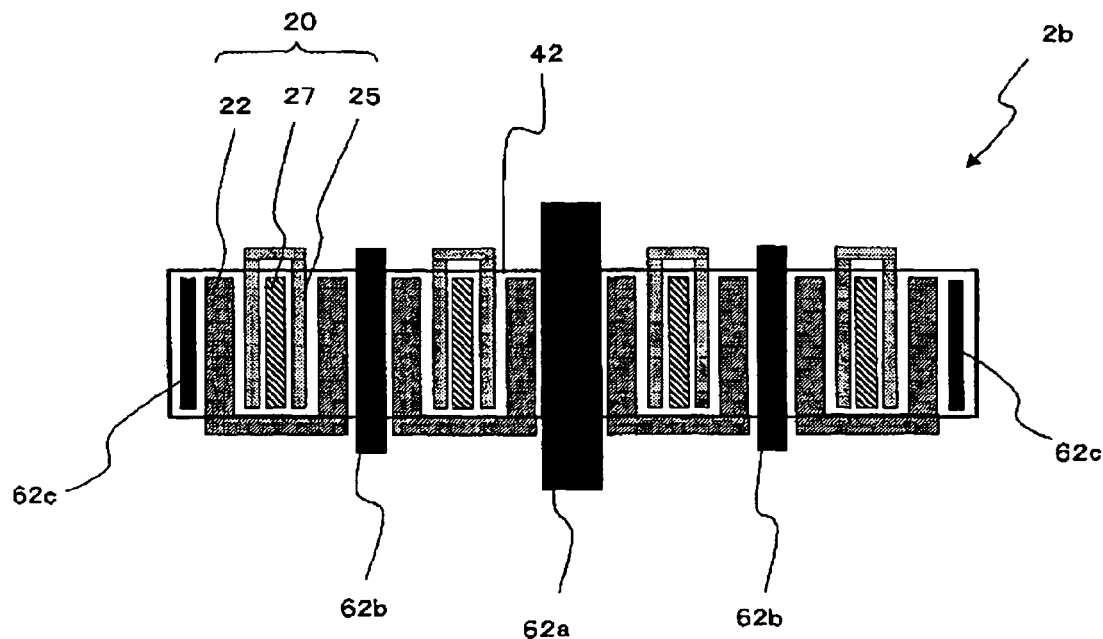
FIG. 9 is a schematic plan view showing a fifth embodiment of the semiconductor device according to the present invention.

FIG. 9 is a plan view showing a fifth embodiment of the semiconductor device according to the present invention. In semiconductor device 2b, a plurality of HBTs 20 as unit semiconductor elements and a plurality of heat dissipating means 60 are one-dimensionally and alternately arranged. In addition, in a region on semiconductor substrate 10 provided with heat dissipating means 60, metal film 62 situated at a relatively central part has a large area of contact with sub-collector layer 12 compared to metal film 62 situated at a relatively peripheral part as in semiconductor device 2. In this embodiment, the area of each metal film 62 is changed by changing both lengths in a direction of arrangement of HBTs 20 and in a direction perpendicular to the direction, and in this sense, this embodiment is different from semiconductor device 2 and semiconductor device 2a in which only the length of any one of the directions is changed. In this connection, in this embodiment, alternatives can be made as in the embodiments described previously as a matter of course.

In semiconductor device 2b having the configuration described above, high heat dissipation performance can be achieved, and the temperature and the current density among a plurality of HBTs can be uniformed as in semiconductor device 2.

The semiconductor device according to the present invention is not limited to those shown in the embodiments described above, but various alternatives are possible. For example, the configuration in which heat dissipating means is placed on both sides of HBT 20 for all HBTs 20 has been shown in the embodiments described above, but as shown in FIG. 10, heat dissipating means 60 may be placed on both sides of each unit with n ($\geq 2$) HBTs as one unit. In other words, heat dissipating means 60 may be provided on every n HBTs along a direction of arrangement of HBTs 20. Heat dissipating means may be provided on every 1, 2 . . . of HBTs 20 in order from an HBT at the center, and arrangements other than this illustrative arrangement may be made as a matter of course.

Figure 10:
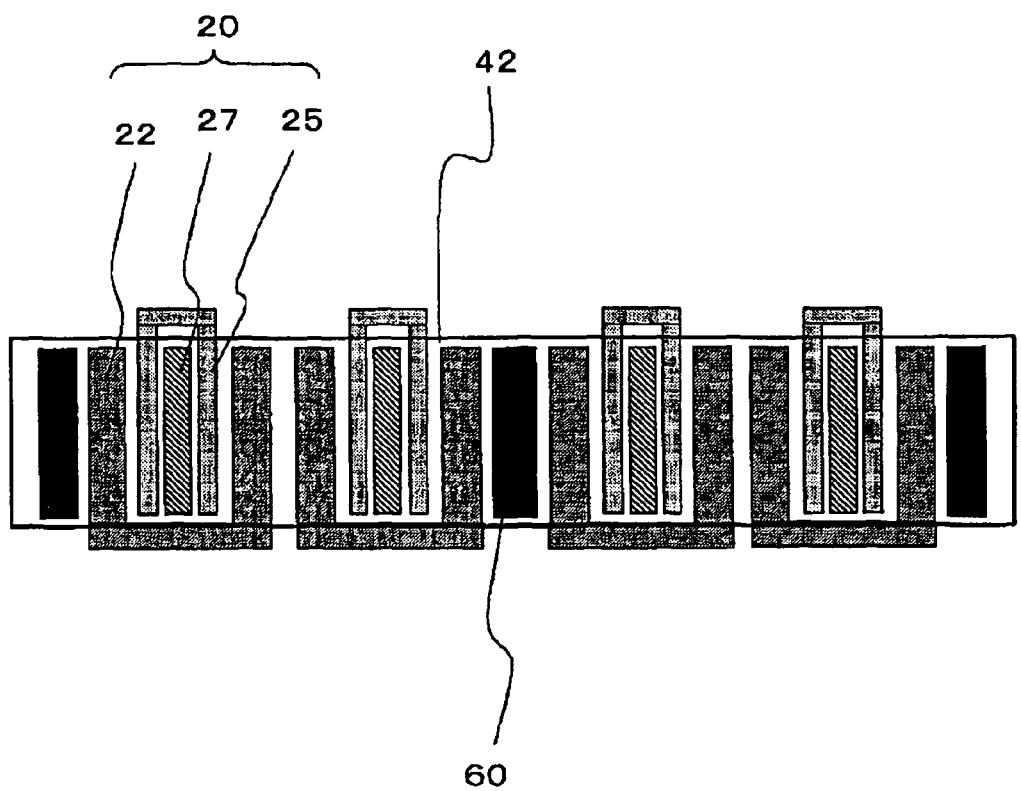
FIG. 10 is a schematic plan view for explaining an alternative example of the semiconductor device according to an embodiment.
Figure 11:
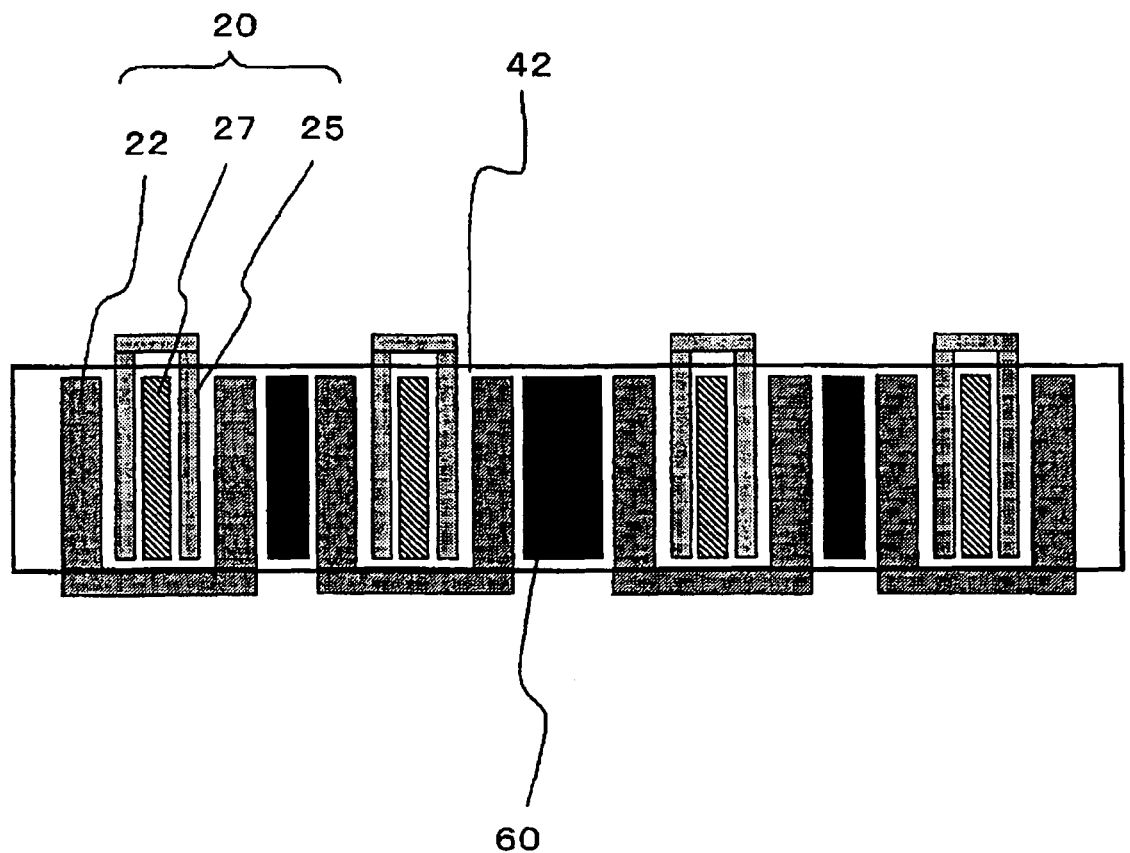
FIG. 11 is a schematic plan view for explaining an alternative example of the semiconductor device according to an embodiment.

In the example of FIG. 10, n equals 2, and in this case, it can be considered that heat dissipating means 60 is placed near each of HBTs 20. In this connection, in FIG. 10, heat dissipating means 60 may have mutually different areas as shown in FIG. 6, etc. or may have the same area Furthermore, in the embodiments described above, the configuration in which heat dissipating means are provided not only between adjacent two HBTs 20 but also at opposite ends of HBTs 20 in a direction of arrangement has been shown, but as shown in FIG. 11, no heat dissipating means may be provided at opposite ends of a direction of arrangement of HBTs 20.

Figure 12:
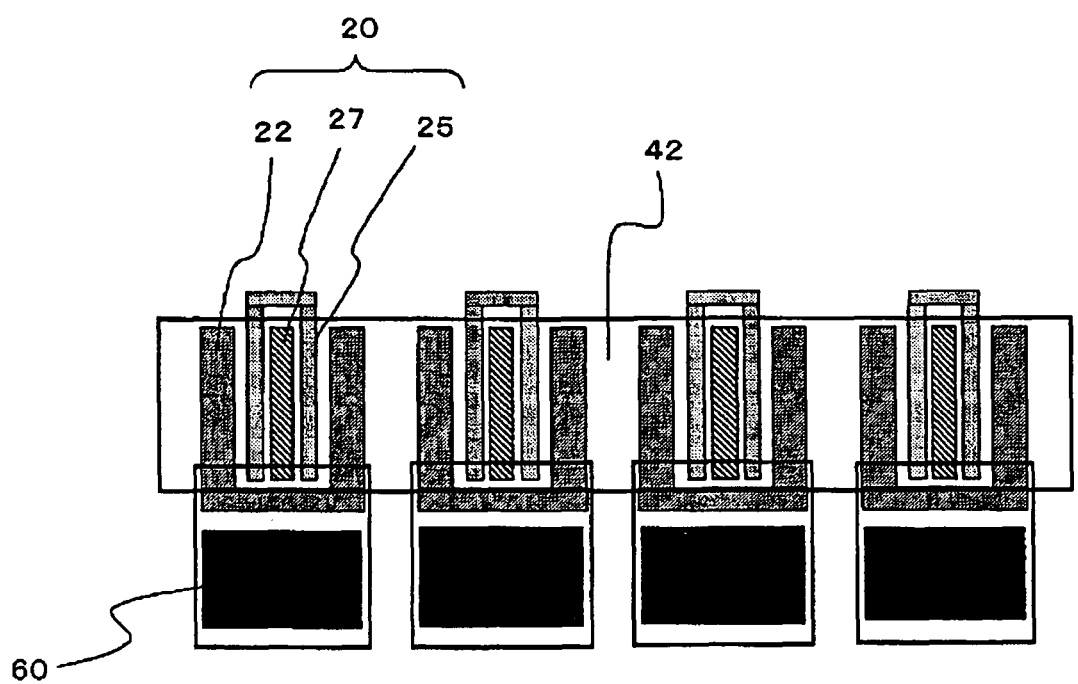
FIG. 12 is a schematic plan view for explaining an alternative example of the semiconductor device according to an embodiment.
Figure 13:
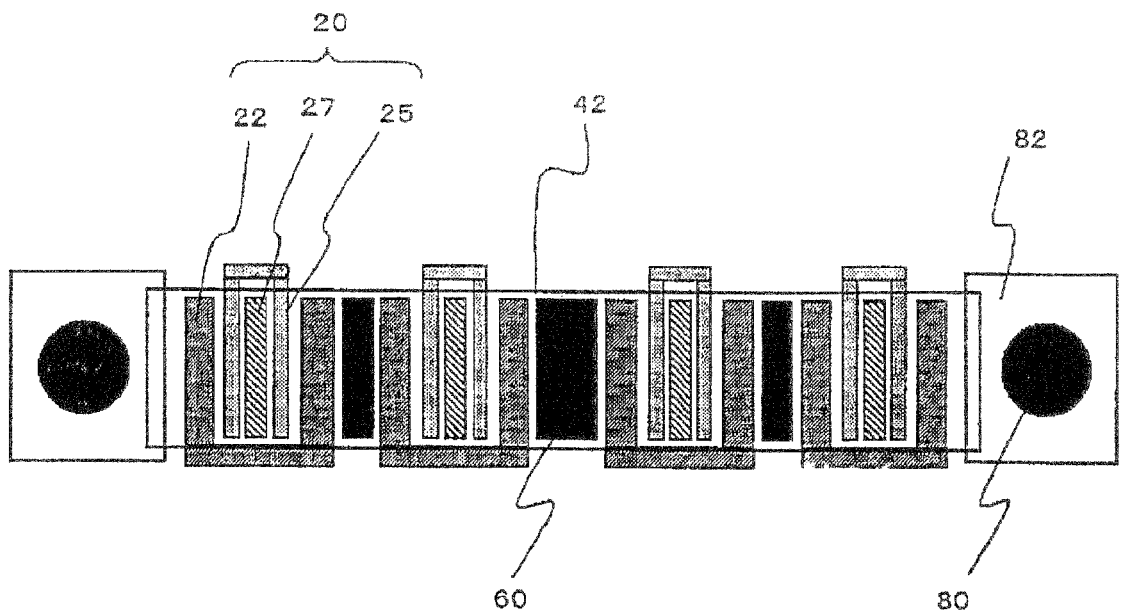
FIG. 13 is a schematic plan view for explaining an example of layout for via holes in the semiconductor device according to an embodiment.

The configuration in which heat dissipating means are provided on the upside and/or the downside of HBTs 20 along a direction of arrangement of HBTs 20 has been shown, but as shown in FIG. 12, heat dissipating means 60 may be provided on the upside and/or downside of HBT 20 along a direction perpendicular to a direction of arrangement of HBTs 20. In this example, heat dissipating means is provided on only one of the upside and the downside. In this connection, in this embodiment, alternatives can be made as in the embodiments described previously as a matter of course.

The case where the number of HBTs 20 is 3 or 4 has been shown, but the number of HBTs 20 is not limited to these values and may be any value.

The case where the number of emitters is 1 and the number of bases is 2 has been shown as the configuration of each HBT 20, but the number of emitters may be 2, and the number of bases is 1 or 3 or more.

HBT 20 in which the combination of the emitter/base/collector is a combination of AlGaAs/GaAs/GaAs has been shown, but HBT 20 may be another GaAa based and InP based HBT of InGaP/GaAs/GaAs, InP/InGaAs/InGaAs, InP/InGaAs/InP or the like, or an Si based HBT of Si/SiGe/Si, SiC/SiGe/Si, SiC/Si/Si or the like.

The GaAs substrate has been shown as semiconductor substrate 10, but substrate 10 may be another compound semiconductor substrate of InP or the like, an insulating substrate, a Si substrate, an SOI substrate, an SOS substrate or the like.

Furthermore, in the embodiments described above, via holes may be formed on semiconductor substrate 10 and filled with a metal for grounding emitter electrode 27 of HBT 20. For a method for producing via holes, the via hole may be filled when forming a metal layer on the back surface using a ordinary plating method described in the conventional technique, etc., but if the thickness of plating is less than ½ of the opening diameter of the via hole, the via hole is not fully filled with a metal (gold is normally used) formed on the side wall of the via hole, and therefore a stress on the semiconductor substrate can be reduced. For the thickness of plating, a thickness allowing the via hole to be fully filled is better in terms of heat dissipation, but the thickness is preferably as large as possible within the bounds of not stressing the semiconductor device, more preferably ¹⁄₁₀ or more of the opening diameter of the via hole, and further preferably ⅕ or more of the via hole.

For example, via holes may be formed on the upside and the downside along a direction of arrangement of HBTs 20 for regions on which HBTs 20 and heat dissipating means 60 are placed. In this case, emitter electrode 27 is electrically connected to via hole 80 via common emitter wiring 42 and pad 82 for the via hole.

Figure 16:
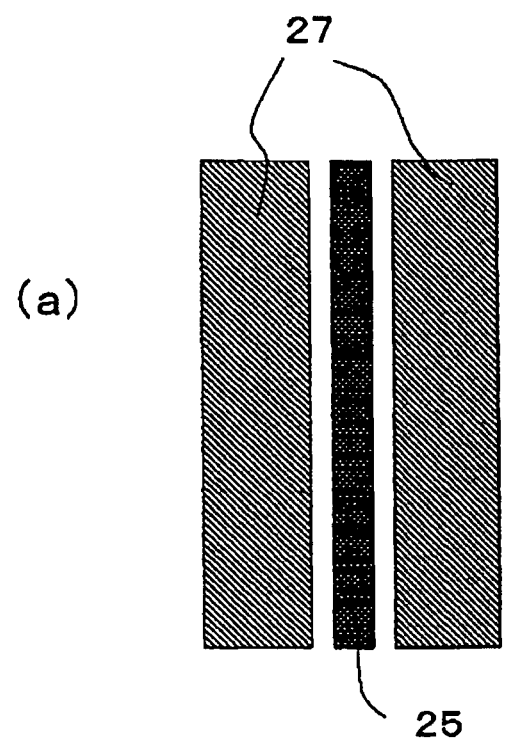
FIGS. 16($a$) and 16($b$) are schematic plan views for explaining an alternative example of the semiconductor device according to an embodiment.
Figure 16:
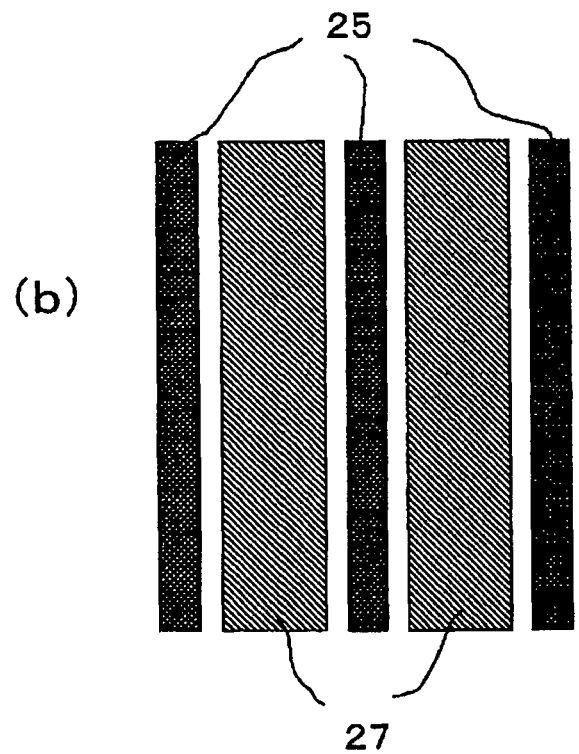

In the embodiments described above, the configuration of so called a double base/single emitter has been shown as the unit semiconductor element, but other configurations may be employed. For example, the configuration may be a single base/double emitter shown in FIG. 16(*a*) or may be a triple base/double emitter shown in FIG. 16(*b*).

Sixth Embodiment

Figure 17:
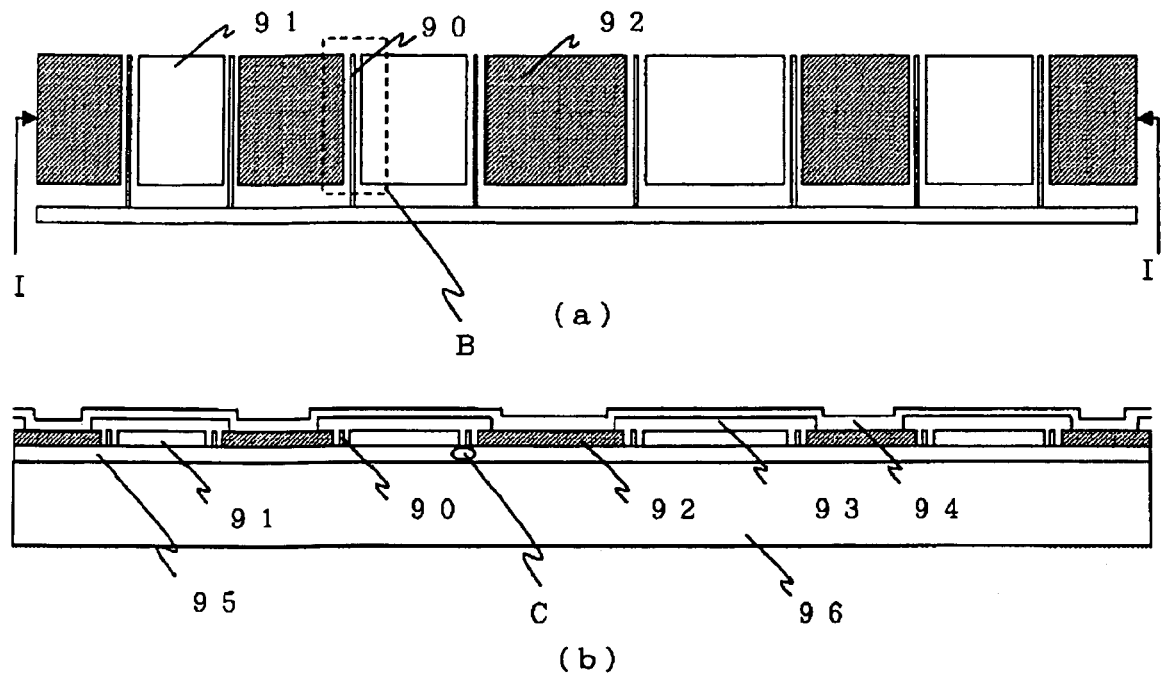
FIGS. 17($a$) and 17($b$) are schematic plan view and cross-sectional view showing a sixth embodiment.
Figure 18:
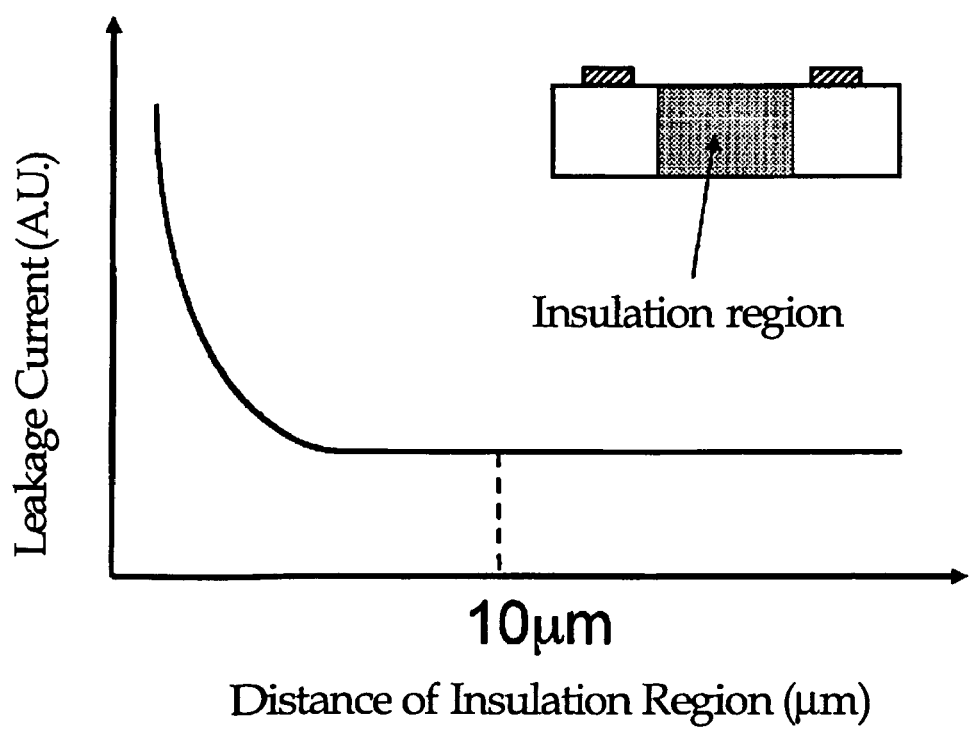
FIG. 18 shows the dependence of a leakage current on a spacing of an insulating region.

FIG. 17(*a*) is a schematic plan view showing this embodiment, and this embodiment will be described using an MESFET as an FET for simplification of explanations. FIG. 17(*b*) is a schematic cross-sectional view of a cross section of line I-I of FIG. 17(*a*).

In FIG. 17(*a*), electrodes of the MESFET formed on semiconductor substrate 96 are shown. Gate electrode 90 is connected to a common electrode at one end, and on both sides thereof are formed drain electrode 91 and source electrode 92. In the case of the MESFET, source/drain and gate electrodes are formed continuously, but the unit semiconductor element is formed in a portion surrounded by dotted line B.

In FIG. 17(*a*), the areas of source electrode 92 and drain electrode 91 situated at the central part of the element are large, and the areas become smaller as going toward the peripheral part. Unlike the conventional technique in which the areas of all electrodes are the same, the area of the electrode at the central part of the element is made larger than the area of the electrode at the peripheral part, and therefore a situation in which the temperature of the element is higher at the central part than at the peripheral part is eliminated.

Even if the area of one of source electrode 92 and drain electrode 91 at the central part of the element is smaller than the area of the electrode at the peripheral part of the element, a same effect is exhibited as a matter of course.

In FIG. 17(*b*), gate electrodes 90, source electrodes 92 and drain electrodes 91 are formed on active layer 95 on semiconductor substrate 96, and source electrodes are continuously connected via a wiring 94 via openings formed above each source electrode 92 in insulating film 93 formed so as to cover gate electrode 90, source electrode 92 and drain electrode 91 and composed of a silicon oxide film.

Since the heat conductivity is improved because source electrodes 92 are interconnected via wiring 94, dissipation of heat from heat generating portion C is improved as compared to a case where source electrodes 92 are discretely placed as in FIG. 17(*a*).

In this connection, the active layer is schematically described and therefore simplified, but in the case of the MESFET, the active layer is formed of a buffer layer, an active layer and a contact layer in this order from the semiconductor substrate side.

The gate electrode is formed on the active layer, and the source electrode and the drain electrode are formed on the contact layer.

In the case of the HEMT, a buffer layer, a channel layer and an electron donating layer are formed in this order from the semiconductor substrate, and the gate electrode is formed on the electron donating layer. Further, a two-layered cap layer is formed on electron donating layer, and the upper cap layer has an impurity concentration higher than the impurity concentration of the lower cap layer.

The cap layer often has a recess structure with the gate electrode portion partly etched away. The source and drain electrodes are formed on the cap layer.

The gate length, the gate-source spacing and the gate-drain spacing may be, for example, 0.7 μm, 1.0 μm and 1.5 μm, respectively.

In this connection, explanations have been given showing the FET in FIGS. 17(a) and 17(b), but in the case of the HBT, a similar effect is obtained by using a contact electrode as a matter of course.

In this example, the source electrode may also be divided into two or more electrodes, wherein an electrode closer to the gate electrode is an electrode for absorption of heat and an electrode distant from the gate electrode is an electrode for dissipation of heat. In this case, the electrode for dissipation of heat may be a Schottky electrode as a matter of course.

In this connection, the present invention can be varied in a variety of ways within the technical concept of the present invention aside from the embodiments described above.

The invention claimed is:

1. A semiconductor device comprises:
   a sub-collector layer formed on a semiconductor substrate,
   a bipolar transistor formed by stacking a collector layer, a base layer and an emitter layer in this order on said sub-collector layer, and
   a heat dissipating means dissipating heat generated in said bipolar transistor to said semiconductor substrate via a wiring connected with an emitter electrode of said bipolar transistor,
   wherein said heat dissipating means is a pn junction diode composed of same layers as said sub-collector layer, collector layer and base layer of said bipolar transistor and spatially separated from said bipolar transistor,
   wherein said collector layer of said bipolar transistor and said collector layer of said pn junction diode are electrically connected to a common collector electrode via said sub-collector layer, and
   wherein one terminal of said diode is connected with said wiring, and
   wherein a width of said wiring connecting between said emitter electrode of said bipolar transistor and said terminal of said diode is not less than the length of the emitter electrode.

2. The semiconductor device according to claim 1, wherein said pn junction diode is a pin diode or $p^+n^-n^+$ diode having depleted $n^-$ layer.

3. The semiconductor device according to claim 2, wherein said pin diode or $p^+n^-n^+$ diode is composed of $p^+$ layer having $1\times10^{19}$ cm$^{-3}$ or more of dose, $n^-$ layer having $1\times10^{17}$ cm$^{-3}$ or less of dose and $n^+$ layer with $1\times10^{18}$ cm$^{-3}$ or more of dose.

4. The semiconductor device according to claim 1, wherein said wiring interconnects electrodes having the same function on a plurality of said bipolar transistors.

5. The semiconductor device according to claim 4, wherein said electrodes having the same function are emitter electrodes.

6. The semiconductor device according to claim 1, further comprising:
   a unit bipolar transistor comprising a plurality of said bipolar transistor; and
   wherein said heat dissipating means is formed between adjacent unit bipolar transistors.

7. The semiconductor device according to claim 6, wherein a plurality of said unit bipolar transistors is formed in a specific arrangement on said semiconductor substrate; and
   wherein said heat dissipating means is also formed on at least one peripheral side of said specific arrangement.

8. The semiconductor device according to claim 6, wherein a plurality of said unit bipolar transistors is formed in a specific arrangement on said semiconductor substrate; and
   wherein the area of a region provided with said heat dissipating means situated at a relatively central part of said specific arrangement is larger than the area of a region provided with said heat dissipating means situated at a relatively peripheral part of said specific arrangement.

9. The semiconductor device according to claim 8, wherein the area of said heat dissipating means depends on the width of said heat dissipating means in a direction parallel to said specific arrangement.

10. The semiconductor device according to claim 8, wherein the area of said heat dissipating means depends on the length of said heat dissipating means in a direction perpendicular to said certain arrangement.

11. The semiconductor device according to claim 8, wherein the area of said heat dissipating means depends on both width and length of said heat dissipating means.

12. The semiconductor device according to claim 8, wherein a plurality of said unit bipolar transistors are arranged in a specific direction and said wiring over the region of said heat dissipating means is extended in a direction perpendicular to said specific direction.

13. The semiconductor device according to claim 12, wherein said wiring is connected to a pad electrode at a terminal of said extended wiring.

14. The semiconductor device according to claim 1, wherein a plurality of said unit bipolar transistors are formed in a specific arrangement on said semiconductor substrate;
   wherein said wiring is extended to at least one direction perpendicular to said specific arrangement; and
   wherein said heat dissipating means is formed under said extended wiring.

15. The semiconductor device according to claim 1, wherein said wiring is formed on an insulating film covering said bipolar transistor and said heat dissipating means, and is connected to the emitter electrode of said bipolar transistor and to the terminal of said heat dissipating means via openings provided in said insulating film.

* * * * *